United States Patent
Shibasaki et al.

(10) Patent No.: US 6,942,534 B2
(45) Date of Patent: Sep. 13, 2005

(54) DISPLAY DEVICE WITH CATHODE CONTAINING LITHIUM AND SILVER AND METHOD FOR MAKING THE SAME

(75) Inventors: Takanori Shibasaki, Kanagawa (JP); Takashi Hirano, Kanagawa (JP); Takao Mori, Kanagawa (JP); Jiro Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 212 days.

(21) Appl. No.: 10/320,958

(22) Filed: Dec. 17, 2002

(65) Prior Publication Data

US 2003/0173893 A1 Sep. 18, 2003

(30) Foreign Application Priority Data

Dec. 18, 2001 (JP) ........................................ 2001-383958
Nov. 29, 2002 (JP) ........................................ 2002-347115

(51) Int. Cl.[7] ................ H01J 9/00; H01J 9/24
(52) U.S. Cl. .................. 445/24; 445/23; 313/506; 313/498
(58) Field of Search .................... 445/23, 24; 313/504, 313/506, 503, 498

(56) References Cited

U.S. PATENT DOCUMENTS

| | | | |
|---|---|---|---|
| 6,366,017 B1 * | 4/2002 | Antoniadis et al. | 313/506 |
| 6,597,111 B2 * | 7/2003 | Silvernail et al. | 313/506 |
| 6,646,373 B1 * | 11/2003 | Su | 313/512 |
| 2001/0041268 A1 | 11/2001 | Arai et al. | |
| 2003/0089252 A1 * | 5/2003 | Sarnecki | 101/170 |
| 2003/0129447 A1 * | 7/2003 | Madathil et al. | 428/690 |
| 2004/0174116 A1 * | 9/2004 | Lu et al. | 313/506 |

FOREIGN PATENT DOCUMENTS

| | | |
|---|---|---|
| EP | 0865089 | 9/1998 |
| EP | 1122800 | 8/2001 |
| JP | 09-283281 | 10/1997 |
| JP | 11-031589 | 2/1999 |

* cited by examiner

Primary Examiner—Joseph Williams
Assistant Examiner—Kevin Quarterman
(74) Attorney, Agent, or Firm—Robert J. Depke; Trexler, Bushnell, Giangiorgi, Blackstone & Marr

(57) ABSTRACT

A top-emitting display unit is fabricated by the following steps: A lower electrode is formed on a substrate. An organic layer including a luminescent sublayer is formed on the lower electrode. Furthermore, an upper electrode containing lithium is formed by a sputtering process into a thickness of 7 nm to 21 nm. The upper electrode functions as a cathode. The lithium content in the upper electrode is in the range of 0.3 to 1.9 percent by weight. In the sputtering process, the upper electrode is preferably formed at a deposition rate of 50 nm/min or less.

5 Claims, 3 Drawing Sheets

DISPLAY DEVICE WITH CATHODE CONTAINING LITHIUM AND SILVER AND METHOD FOR MAKING THE SAME

This application claims priority to Japanese Patent Application Numbers JP2001-383958 filed Dec. 18, 2001 and JP2002-347115 filed Nov. 29, 2002, which are incorporated herein by reference.

BACKGROUND OF THE INVENTION

1. Field of the Invention

The present invention relates to display units and methods for making the same. In particular, the present invention relates to a display unit including a luminescent device that has an organic layer between electrodes and relates to a method for making the same.

2. Description of the Related Art

A typical organic electroluminescent (EL) device based on electroluminescence of an organic material has an organic layer that includes an organic hole transport sublayer and an organic luminescent sublayer between an anode and a cathode. The organic EL device has attracted attention as a high-brightness luminescent device that can be driven by low DC voltage. The organic EL device has a structure including a substrate, a lower electrode functioning as the anode or cathode on the substrate, the organic layer including the luminescent sublayer on the lower electrode, and an upper electrode functioning as the cathode or anode. The light emerging from the organic layer is emitted through the substrate or the upper electrode.

In the production of such an organic EL device, the lower electrode is formed on the substrate by patterning, the organic layer including the luminescent sublayer is deposited on the lower electrode, and then the upper electrode is formed on the organic layer while insulation of the upper electrode from the lower electrode is being ensured.

In this method, each layer is formed, for example, by sputtering or vacuum evaporation. In the process, the upper electrode must be formed without damaging the underlying organic layer. If the organic layer is damaged, the luminescent efficiency to the amount of charge injected decreases. Thus, a large current must be applied between the electrodes for achieving high brightness. Unfortunately, a large current in the organic EL device accelerates deterioration of the organic layer, resulting in a decrease in lifetime (brightness half-life) and an increased in power consumption of the display unit.

In view of such circumstance, the upper electrode is generally formed by vacuum deposition which less damages the underlying organic layer. When the upper electrode is formed by sputtering, an organic buffer layer composed of, for example, copper phthalocyanine is provided on the organic layer, and the upper electrode is formed on the buffer layer to protect the organic layer during the sputtering process, as disclosed in, for example, Japanese Unexamined Patent Application Publication Nos. 2000-58266 and 2000-340364 and U.S. Pat. No. 6,172,459B1.

However, this method has the following disadvantages: The method requires an additional step for forming the buffer layer on the organic layer, resulting in an increase in production cost and a complicated display unit structure.

Furthermore, the buffer layer of the resulting display unit absorbs light of a specific wavelength range; hence, the display unit does not have desired light-emitting characteristics in this specific wavelength range. For example, the buffer layer composed of copper phthalocyanine has a large absorption peak in a red wavelength range, more specifically absorbs about 20% light even if the layer thickness is 14 nm. Thus, a red organic EL device exhibits a low light-emitting efficiency, in other words, low external quantum efficiency.

Such low external quantum efficiency results in an increase in current for achieving required brightness and a decrease in brightness half-life.

When the upper electrode is formed by vacuum evaporation, the deposition rate is unstable. Thus, the resulting upper electrode does not have a predetermined thickness. When the upper electrode is formed by co-evaporation using a plurality of materials, it is difficult to fix the composition. Thus, many idling hours are required for stabilizing the composition in the co-evaporation. Furthermore, these materials must be supplied frequently. Accordingly, the vacuum evaporation process has reduced productivity.

SUMMARY OF THE INVENTION

An object of the present invention is to provide a method for making a display unit that can form an upper electrode without damaging an organic layer and has high productivity.

Another object of the present invention is to provide a display unit exhibiting a long brightness half-life.

According to the present invention, a method for making a top-emitting display unit emitting light from an upper electrode, includes forming a lower electrode on a substrate; forming an organic layer including a luminescent sublayer on the lower electrode; and then forming the upper electrode containing lithium on the organic layer by a sputtering process, the upper electrode functioning as a cathode.

In the top-emitting display unit emitting light from the upper electrode, the upper electrode does not need to have reflectivity and thus may be thin when the upper electrode is formed by sputtering, damage to the underlying organic sublayer is moderated. Thus, the resulting display unit has high luminescent efficiency. Since the upper electrode contains lithium (Li), it functions as a cathode, In particular, an upper electrode containing silver (Ag) as the major component having low absorbance and lithium exhibits low optical loss and a high light-emitting efficiency. Accordingly, the display unit has a prolonged service life and high efficiency.

A top-emitting display unit according to the present invention includes a substrate; a lower electrode on the substrate; an organic layer including a luminescent sublayer on the lower electrode; and an upper electrode on the organic layer, the upper electrode containing lithium and functioning as a cathode.

DESCRIPTION OF THE PREFERRED EMBODIMENTS

Figure 3:
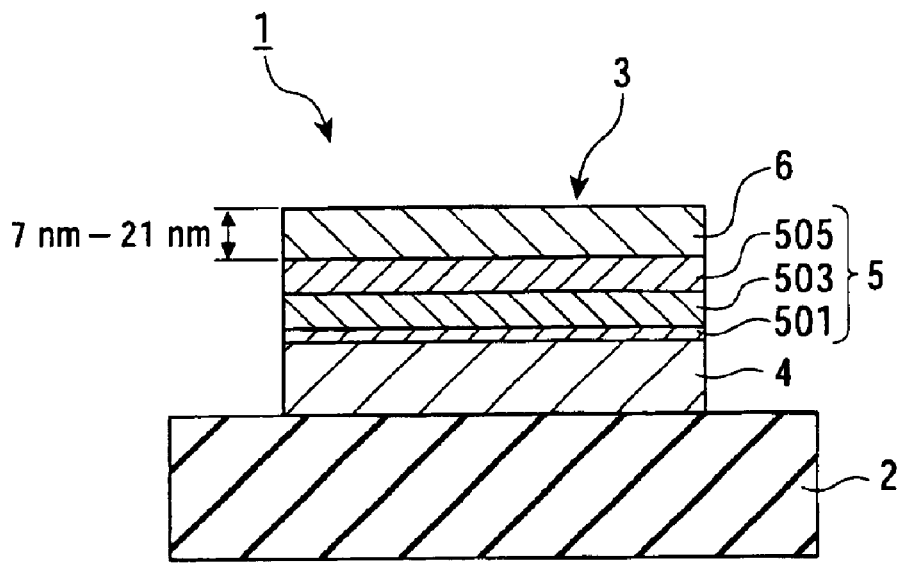
FIG. 3 is a cross-sectional view of a display unit according to an embodiment of the present invention.

The preferred embodiments of a method for making a display unit and the display unit according to the present invention will now be described in detail with reference to the drawings. FIG. 3 is a cross-sectional view of the display unit according to an embodiment. The display unit 1 includes an organic EL device 3 on a substrate 2. The structure of the display unit 1 will be apparent from the following method for making the display unit 1.

The substrate 2 prepared may be a glass, silicon, or plastic plate, or a TFT substrate having TFTS (thin film transistors). Preferably, the substrate 2 is composed of a transparent material when the display unit 1 is of a transparent type that emits light through the substrate 2.

Next, a lower electrode 4 is formed on the substrate 2. The lower electrode 4 functions as an anode in this embodiment. Thus, the lower electrode 4 is preferably composed of a material having a large work function. Examples of such materials include nickel, gold, platinum, palladium, selenium, rhodium, ruthenium, iridium, rhenium, tungsten, molybdenum, chromium, tantalum, niobium, alloys thereof, tin oxide, indium tin oxide (ITO), zinc oxide, and titanium oxide.

The lower electrode 4 is patterned into a shape that is suitable for a drive mode of the display unit 1. When the display unit 1 is driven by a simple matrix mode, the lower electrode 4 is shaped into a stripe pattern. When the display unit 1 is driven by an active matrix mode in which pixels have respective TFTs, the lower electrode 4 is patterned so as to correspond to the arrangement of pixels and is connected to the TFTs with contact holes (not shown) formed in an insulating interlayer covering the TFTs.

An organic layer 5 is formed on the lower electrode (anode) 4. The organic layer 5 includes a hole injection sublayer 501, a hole transport sublayer 503, a luminescent sublayer 505, and an electron transport sublayer (not shown). These sublayers are formed on the lower electrode 4 in that order. However, the organic layer 5 may have any other structure.

Each sublayer of the organic layer 5 may be composed of any known material and be formed by any known process, for example, a vacuum evaporation process or a spin coating process. The thickness of the organic layer 5 is adjusted such that the display unit 1 exhibits a microcavity effect, namely, light emerging from the luminescent sublayer 505 is resonated by reflection on the top and bottom faces of the organic layer 5.

An upper electrode 6 contains lithium is formed on the organic layer 5 by a sputtering process into a thickness of 7 nm to 21 nm. The upper electrode 6 functions as a cathode.

The lithium content in the upper electrode 6 is in the range of 0.3 to 1.9 percent by weight. Preferably, the upper electrode 6 contains silver as the major component. However, the upper electrode 6 may contain any other material. Examples of such materials include aluminum, nickel, copper, germanium, rhodium, palladium, indium, tin, iridium, platinum, gold, ruthenium, alkali metals such as sodium, potassium, rubidium, cesium, and francium, alkaline earth metals such as magnesium, calcium, strontium, barium, and radium, and lanthanides such as lanthanum, cerium, praseodymium, neodymium, promethium, samarium, europium, gadolinium, terbium, dysprosium, holmium, erbium, thulium, ytterbium, and lutetium.

In the sputtering process, the upper electrode 6 is preferably formed at a deposition rate of 50 nm/min or less.

When the display unit 1 is of a simple matrix type, the upper electrode 6 also has a stripe pattern that is orthogonal to the stripe pattern of the lower electrode 4. The organic EL device 3 is formed at each crossing position. When the display unit 1 is of an active matrix type, the upper electrode 6 is a solid layer that extends over the entire substrate 2 and functions as a common electrode to all the pixels.

When the display unit 1 is of a top-emitting type that emits light from the upper electrode 6, the upper electrode 6 must have adequate light transmittance. Since a significantly low transmittance causes a decrease in external quantum efficiency, the current density must be increased in order to achieve a desired level of brightness. As a result, the brightness half-life of the display unit decreases.

Figure 1:
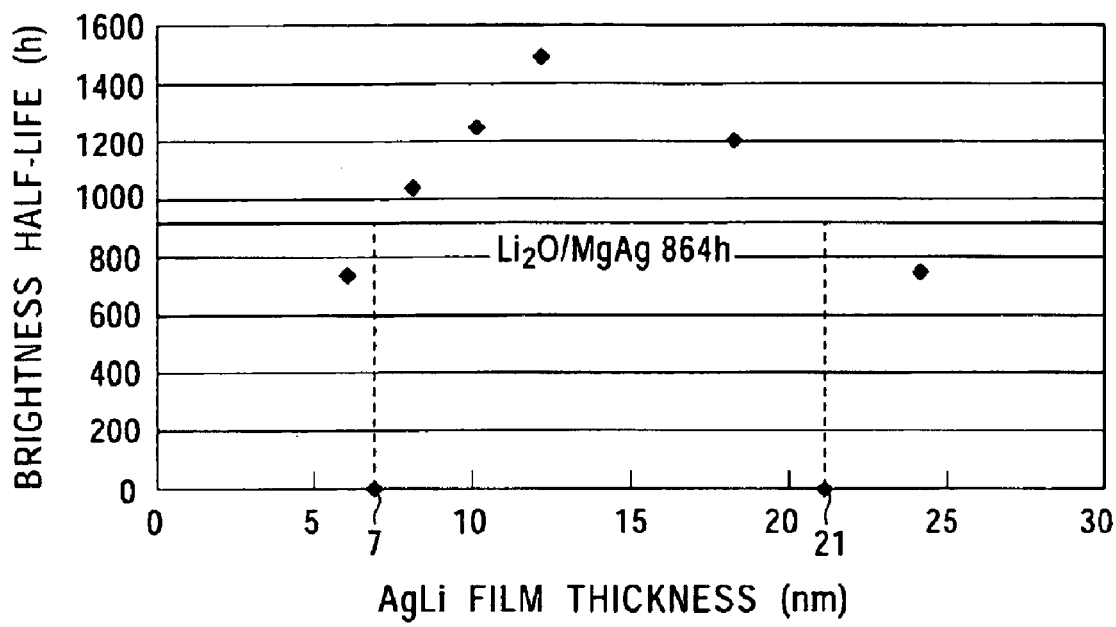
FIG. 1 is a graph illustrating the relationship between the thickness of an AgLi upper electrode formed by a sputtering process and the brightness half-life of a display unit including the upper electrode.

FIG. 1 is a graph illustrating the relationship between the brightness half-life of the display unit and the thickness of the AgLi upper electrode. Here, the brightness half-life is a time when the brightness of the organic EL decreases to half the initial brightness due to an increase in drive voltage during continuous lighting at a constant current. A reference display unit having an upper electrode composed of silver and magnesium and formed by vacuum evaporation has a brightness half-life of 864 hours. The display unit having the upper electrode formed by the sputtering has a brightness half-life of 864 hours or more within the thickness range of 7 nm to 21 nm. Accordingly, the thickness of the AgLi upper electrode must be 21 nm or less in order to increase the brightness half-life.

Figure 2:
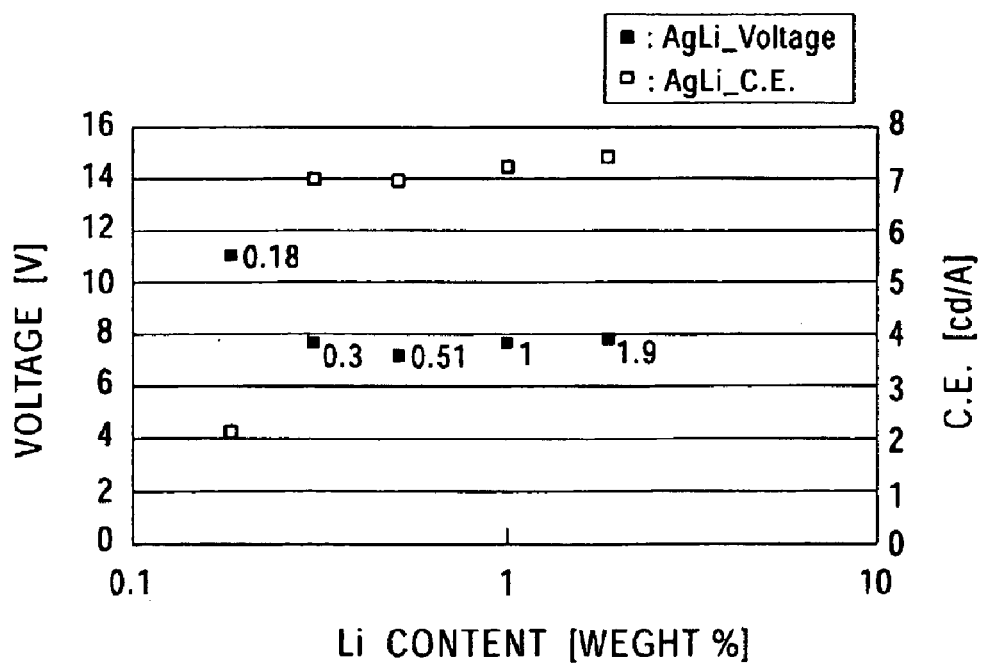
FIG. 2 is a graph of the relationship between the voltage and quantum efficiency and the lithium content in an AgLi film.

The brightness half-life is satisfactorily high when the lithium content in the upper electrode is in the range of 0.3 to 1.9 percent by weight. FIG. 2 is a graph of the relationship between the display unit characteristics and the lithium content when the lithium content is varied within the range of 0.18 to 1.9 percent by weight. FIG. 2 shows that the drive voltage (merely "voltage" in the drawing) and the external quantum efficiency (C.E.) substantially do not change within the lithium content of 0.3 to 1.9 percent by weight within the above thickness and the lithium content, the upper electrode can be formed by a sputtering process without damage of the organic layer. Furthermore, the resulting display unit shows a drive voltage, an external quantum efficiency, and a brightness half-life that are comparable with those of a display unit formed by a vacuum evaporation process.

Figure 4:
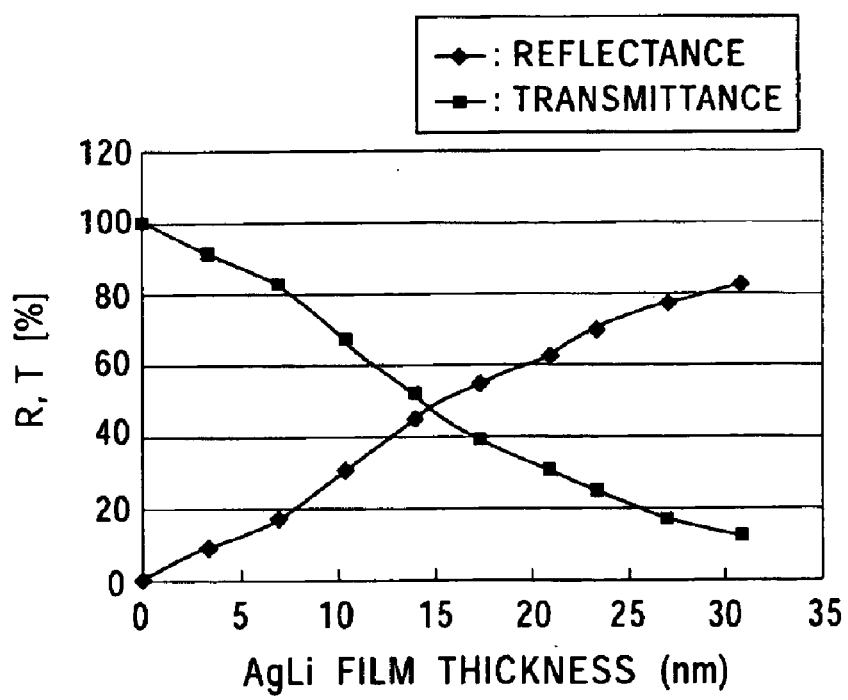
FIG. 4 is a graph illustrating the relationship between the reflectance and transmittance and the thickness of an AgLi film.

The lower limit of the transmittance required for the upper electrode 6 will now be discussed. FIG. 4 is a graph illustrating the relationship between the reflectance and transmittance at a wavelength of 550 nm and the thickness of AgLi films containing 98.1 percent by weight of silver and 1.9 percent by weight of lithium (substantially the same curves were obtained from a composition of 99.7 percent by weight of silver and 0.3 percent by weight of Li). Since the maximum thickness is 21 nm to achieve a required brightness half-life, the transmittance of the upper electrode 6 must be at least 30%. When the upper electrode 6 has a transmittance of 30% or more, the display unit 1 can be used as a top-emitting display unit. The transmittance and reflectance of the upper electrode 6 also depend on the composition of the upper electrode 6. Thus, the thickness of the upper electrode 6 is determined in view of its composition. Silver is a metal having small absorbance, and the optimum thickness of an electrode having larger absorbance is smaller; thus, the maximum thickness of the upper electrode 6 is 21 nm.

Accordingly, the resulting display unit 1 includes the organic EL device 3 including the lower electrode 4, the organic layer 5, and the upper electrode 6 deposited in that order on the substrate 2. The upper electrode 6, composed of silver as the primary component and containing lithium, of this display unit 1 is formed by a sputtering process.

A protective film (not shown in FIG. 3) composed of magnesium fluoride, calcium fluoride, or silicon nitride is formed on the substrate 2 to cover the organic EL device 3. The protective film prevents deterioration of the organic EL device 3 by moisture and oxygen in air. Preferably, the display unit 1 is bonded to a counter substrate with a thermosetting resin, followed by curing the resin by UV irradiation or heat, such that the organic EL device 3 is sealed by the resin.

In this embodiment, as described above, the upper electrode 6 containing lithium is formed on the organic layer 5 by a sputtering process. Since the display unit I is of a top-emitting type emitting light from the upper electrode 6, the upper electrode 6 may have low reflectance. In other words, the upper electrode 6 may have a small thickness. As a result, the upper electrode 6 can be deposited by a sputtering process having high productivity without damaging the underlying organic layer 5 due to a reduced time. Thus, the display unit can be produced with high production efficiency and exhibits high luminous efficiency and long-term reliability.

When the thickness of the upper-electrode 6 is in the range of 7 nm to 21 nm, the damage of the organic layer 5 is minimized during the formation of the upper electrode 6. When the upper electrode 6 contains silver as the major component and lithium, the display unit 1 has higher luminous efficiency. Furthermore, the upper electrode 6 containing silver can be deposited at a higher deposition rate in the sputtering process. Thus, the upper electrode 6 having a desired thickness can be formed without damaging the underlying organic layer 5.

When the upper electrode 6 contains silver, the upper electrode 6 has high adhesiveness to the organic layer 5 and is stable in moisture and oxygen. Furthermore, the upper electrode 6 formed by the sputtering process is highly dense, and prevents penetration of moisture into the organic layer 5. In addition, the upper electrode 6 containing lithium having a small work function can function as a cathode; thus, the display unit can be used at a reduced drive voltage. Accordingly, the display unit has a prolonged life due to suppressed deterioration of the organic layer 5.

In the present invention, as described above, the upper electrode 6 can be formed by a sputtering process without damaging the organic layer 5 not having a buffer layer, with high productivity. The resulting display unit has a prolonged lifetime,

EXAMPLE

With reference to FIG. 2, a chromium lower electrode 4 was formed into a thickness of 200 nm on an inner surface of a glass substrate 2 with a thickness of 0.7 mm by a DC magnetron sputtering process. The surface of the lower electrode 4 was exposed to an oxygen plasma for 30 seconds to form a chromium oxide layer on the lower electrode 4.

The substrate 2 was transferred into an organic deposition chamber through a vacuum system at $10^{-4}$ Pa without exposing the substrate 2 to air. While the chamber was being evacuated to about $3 \times 10^{-5}$ Pa, 2-TNATA [4,4',4"-tris(2-naphtylphenylamino)triphenylamine] was deposited into a thickness of 30 nm, an α-NPD [4,4'-bis(N-(1-naphthyl)-N-phenylamino)biphenyl] was deposited into a thickness of 20 nm, and then an $Alq_3$ [tris(8-quinolinolato)aluminum(III)] containing coumarin 6 was deposited into a thickness of 30 nm.

The substrate 2 was transferred into another deposition chamber for forming a cathode through a vacuum system at $10^{-4}$ Pa without exposing the substrate 2 to air. Using an AgLi (lithium content: 3.0 percent by weigh) target, an AgLi cathode (upper electrode 6) was formed into a thickness of 12 nm by a DC magnetron sputtering process at a DC power of 60 W and a sputtering time of 316 seconds in an argon sputtering gas atmosphere with a gas pressure of 0.2 Pa.

The substrate 2 was transferred into a chemical vapor deposition chamber without exposing the substrate 2 to air. A silicon nitride (SiN,) protective film was formed on the substrate 2 into a thickness of 3 μm. Deposition gases used were silane ($SiH_4$), ammonia ($NH_3$), and nitrogen ($N_2$).

The substrate 2 was placed into air, a photocurable resin was placed dropwise onto the protective film, and the inner surface of the substrate 2 was bonded to a glass counter substrate with a thickness of 0.7 mm. The photocurable resin was cured by UV irradiation to seal the organic EL device between the substrate 2 and the counter substrate.

For COMPARATIVE EXAMPLE, in the above procedure, a $Li_2O$ electron injection conductive layer was formed into a thickness of 1 nm by a vacuum deposition process and an upper electrode composed of Mg:Ag (10:2 by volume ratio) was formed into a thickness of 12 nm to prepare a display unit having a multilayer upper electrode. Since the optical characteristics of electrodes are different between AgLi and MgAg if the total thickness of the organic layer is the same, the chromaticity of the emitted light is different therebetween due to the microcavity effect. Thus, the thickness of the organic layer in COMPARATIVE EXAMPLE was controlled so that EXAMPLE and COMPARATIVE EXAMPLE had the same chromaticity.

Evaluation of Initial Characteristics

A DC current was applied between the lower electrode and the upper electrode of each of the resulting display units of EXAMPLE and COMPARATIVE EXAMPLE. For achieving a brightness of 1,130 $cd/m^2$, the quantum efficiency was 7.3 cd/A at an applied voltage of 7.6 V in EXAMPLE, and 6.5 cd/A at an applied voltage of 7.0 V in COMPARATIVE EXAMPLE. These display units had the same chromaticity.

The results show that the display unit of the present invention having the upper electrode formed by the sputtering process and not having a buffer layer emitted light at the same drive voltage and quantum efficiency as those of COMPARATIVE EXAMPLE having the upper electrode formed by a vacuum evaporation process.

Evaluation of Continuous Lighting Lifetime and Increase in Voltage

Figure 5:
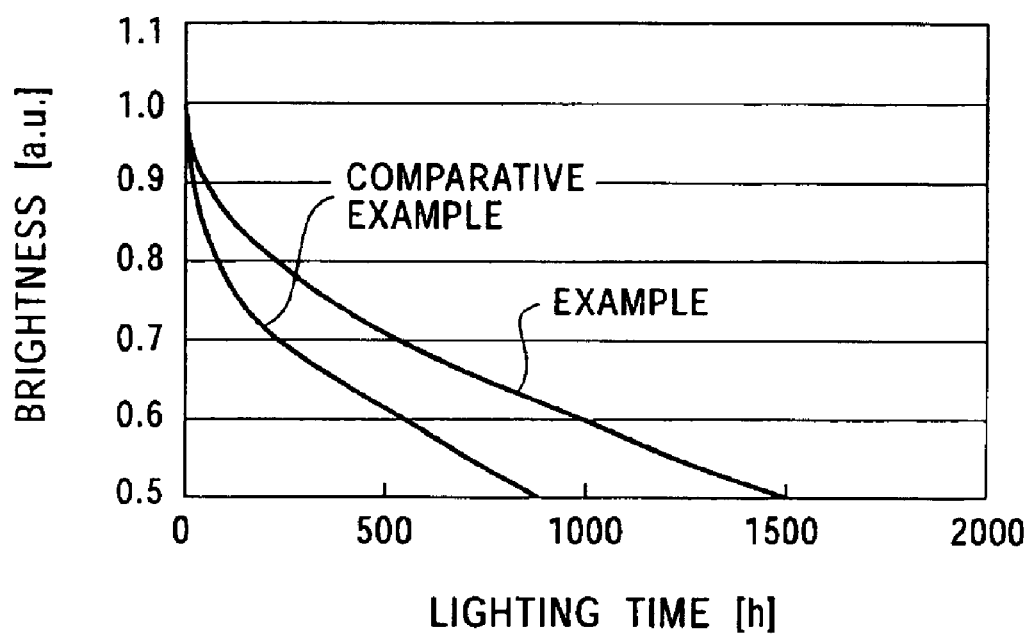
FIG. 5 is a graph illustrating the relationship between the brightness and the continuous lighting time at a constant current.

A decrease in brightness of each display unit was evaluated when the display unit was continuously turned on at a constant current. FIG. 5 is a graph illustrating the relationship between the brightness and the lighting time. FIG. 5 shows the display unit of EXAMPLE had a longer lighting life compared with the display unit of COMPARATIVE EXAMPLE. In the continuous lighting, the increase in drive voltage was substantially the same in these display units.

Accordingly, the display unit having the upper electrode formed by the sputtering process and not having a buffer layer on the organic layer substantially has the same characteristics as the display unit having the upper electrode formed by the vacuum evaporation process.

What is claimed is:

1. A method for making a top-emitting display unit emitting light from an upper electrode, comprising:
   forming a lower electrode secured to a substrate;
   forming an organic region including a luminescent sub-layer above the lower electrode; and then forming the upper electrode containing silver as the primary component and lithium as a secondary component above the organic region by a sputtering process, the upper electrode functioning as a cathode.

2. The method according to claim 1, wherein the lithium content of the upper electrode is in a range of 0.3 to 1.9 percent by weight.

3. The method according to claim 1, wherein the upper electrode is formed by the sputtering process at a deposition rate of 50 nm/min or less.

4. The method according to claim 1, wherein the upper electrode has a thickness in the range of about 7 nm to 21 nm.

5. The method according to claim 1, wherein the upper electrode has a transmittance of at least 30% for light having a wavelength of 550 nm.

* * * * *